United States Patent [19]
Stein et al.

[11] Patent Number: 6,064,261
[45] Date of Patent: May 16, 2000

[54] WRITE AMPLIFIER WITH IMPROVED SWITCHING PERFORMANCE, OUTPUT COMMON-MODE VOLTAGE, AND HEAD CURRENT CONTROL

[75] Inventors: Anatoli B. Stein, Los Altos; Nahum Guzik; Mikhail Korenblioum, both of Palo Alto, all of Calif.

[73] Assignee: Guzik Technical Enterprises, San Jose, Calif.

[21] Appl. No.: 09/299,187

[22] Filed: Apr. 23, 1999

[51] Int. Cl.[7] .................................................. H03F 3/45
[52] U.S. Cl. .............................................. 330/252; 360/67
[58] Field of Search .................................. 330/252, 258; 360/67, 68

[56] References Cited

U.S. PATENT DOCUMENTS 5,434,717  7/1995  Yoshinaga et al. ........................ 360/68
5,770,968  6/1998  Cameron .................................... 360/67

*Primary Examiner*—Robert Pascal
*Assistant Examiner*—Patricia T. Nguyen
*Attorney, Agent, or Firm*—McDermott Will & Emery

[57] ABSTRACT

A write amplifier is provided with one or more improved switching performance, low output common-mode voltage, and precise write head current control. A low output common-mode voltage is achieved using a combination of circuit components which limit the undesirable delivery of current from a differential pair of transistors used for switching, or steering, the current delivered to the write head. Additionally, a voltage source within the amplifier precisely controls the write current delivered to the differential pair. Toward that end, the introduction of operational amplifiers, resistors, and a transistor to provide a circuit wherein the current delivered to the write head by the voltage source is predominantly a function of a write current and a corresponding resistive network, comprised of the write head and resistors connected to the collectors of the differential pair, and wherein the write head current is substantially independent of the current used to perform switching through the differential pair itself. Furthermore, the switching of the differential pair is improved by tying the bases of the differential pair together and capacitively bypassing them to ground and connecting them to an adjustable voltage source, such that the voltage at the bases prevents overdrive of the differential pair of transistor. Additional resistors are also added to damp any remaining transients caused during the switching process.

12 Claims, 2 Drawing Sheets

WRITE AMPLIFIER WITH IMPROVED SWITCHING PERFORMANCE, OUTPUT COMMON-MODE VOLTAGE, AND HEAD CURRENT CONTROL

BACKGROUND OF THE INVENTION

The present invention relates to devices used for the amplification of electrical signals within a data storage device. More specifically, the present invention involves an improved write amplifier which drives a magnetic write head, which is used to write data onto magnetic media.

A magnetic write head is used in a variety of devices wherein data, or a data pattern, is written onto a magnetic media, such as a disk in a hard drive in a typical personal computer. To write a data pattern onto a magnetic medium, a sequence of bits comprising a data pattern is transformed into a series of current pulses of alternating polarity for the respective 1 or 0 values of the bits. The final circuit that creates these current pulses and drives them through the magnetic head is called a write amplifier or write driver. The data to be written by the write head is referred to herein as "write data".

An example of a prior art write amplifier 300 is shown in FIG. 1. Write amplifier 300 includes an emitter coupled differential pair of transistors Q1 10 and Q2 20. The emitters are coupled to a current source established by a transistor Q3 70, resister RW 80 and a negative supply V−. The collectors of transistors Q1 and Q2 are coupled by a respective one of resistors RC1 50 and RC2 60 to a positive supply V+. A magnetic write head 40 is coupled across the collectors of transistors Q1 and Q2.

In the operation of amplifier 300, a differential signal representation of the write data is applied to the inverting and non-inverting inputs of an input differential receiver U1 30, which has two outputs, one being the inverted form of the other. The outputs of differential receiver 30 are coupled to the bases of the emitter coupled transistors Q1 and Q2. As a function of the successive bit values of the write data, one of transistors Q1 and Q2 is switched on and the other is switched off, to effect control of the direction of current from the collector of transistors Q1 and Q2 through the magnetic write head 40. Resistors RC1 50 and RC2 60 are each used to bias a corresponding collector of the emitter coupled pair Q1 and Q2. The values of RC1 50 and RC2 60 are typically much larger than the resistance of the write head 40, so that most of the current switched by the emitter coupled pair is driven through the write head 40.

The magnitude of the write current, i.e., the magnitude of the current driven through the write head 40 from the emitter coupled pair Q1, Q2, is a function of the current source formed by transistor Q3 70, resistor RW 80 as driven by an operational amplifier (OP AMP) U2 90 and digital-to-analog converter (DAC) 100. DAC 100 is user-controlled to provide a voltage at its output that is applied to the non-inverting input of U2. The inverting input of U2 is coupled to the emitter Q3. The output of U2 drives the base of Q3. With this configuration, a desired current is provided from the collector of Q3 to the emitters of Q1 and Q2. Most of that current is delivered to the collectors of the differential emitter coupled pair Q1 and Q2, and from there, through the write head 40 in a direction corresponding to the successive bits of the applied write data.

The prior art amplifier 300 depicted in FIG. 1 has several important disadvantages which limit its utility. Some of these disadvantages have become increasingly limiting in recent years because of the miniaturization of magnetic heads and increasing data rates, thereby diminishing the attractiveness and utility of this relatively simple amplifier circuit 300. Several of those disadvantages are described below.

One such disadvantage relates to the voltage drop across the resistors RC1 50 and RC2 60, which varies as a function of the current delivered by the programmed DAC 100. When that current is small, the voltage drop is small too, and the output common-mode voltage at the magnetic head 40 is close to the positive supply V+, which is a severe problem for magneto-resistive (MR) type heads which are easily damaged by such a high voltage. Ideally, the DC voltage between the head 40 and the disk (not shown) should be zero volts.

Another disadvantage of the write amplifier 300 is that the current through the write head 40, is controlled to be only approximately established by the programmed setting of DAC 100. The difference in current from the programmed value is due to the collector currents of the respective bipolar transistors Q1 10, Q2 20, and Q3 70 being inherently unequal to their emitter currents. Furthermore, the differences in the currents of the respective transistors vary with temperature and the absolute value of the current, and as a consequence, cannot easily be calibrated and adjusted out.

Additionally, there is a problem with the quality of the switching current waveform achievable from the amplifier circuit 300. Ideally, the waveform is a square wave. However, there is a resonant circuit established by the equivalent inductance of the emitters of Q1 10 and Q2 20, and the equivalent capacitance of the collector of Q3 70. The resonant circuit causes a transient condition during switching which propagates to the collectors of Q1 10 and Q2 20, resulting in undershoot and overshoot in the nominal square are write current going into the write head 40.

Additionally, when the switching voltage at the bases of transistors Q1 and Q2 is significantly more than that required to fully steer the current through either one of the two transistors, additional overshoot and undershoot may occur.

It is therefore clear that the prior art amplifier circuit 300 of FIG. 1 has several significant disadvantages. Accordingly, it is desirable to address these disadvantages and achieve, among other benefits, lower common-mode voltage at the write head 40, better control over the write current, and reduced overshoot and undershoot.

SUMMARY OF THE INVENTION

This invention is an improved write amplifier circuit for driving a magnetic write head. The improved amplifier uses an emitted coupled differential pair of transistors, to drive current in selected directions through a magnetic head coupled across the collectors of the emitter coupled transistors, in a manner somewhat similar to the prior art. However, the invention provides one or more of the following improvements: (i) control of the power supply voltage of the emitter coupled transistors to achieve low output common-mode voltage at the magnetic write head; (ii) control of the absolute value of the write head current is achieved through the use of feedback from the collectors of the emitter coupled pair; and (iii) steering of the write current through the differential pair using emitter switching, rather than base switching, thereby reducing the resonance at the emitters by reducing the effective resistance at the emitters and providing for better control of the differential base waveform amplitude.

A lower output common-mode voltage is achieved through a combination of circuit components which limit the undesirable delivery of voltage from the differential pair during switching to the write head. Additionally, the current source within the amplifier has been improved to better control the write current delivered to the differential pair. Toward that end, the introduction of operational amplifiers, resistors, and a transistor to provide a circuit wherein the current delivered to the write head by the current source is a function of the resistive network comprised of the write head and the biasing resistors of the differential pair. Thus, in the present invention, the current delivered to the write head from the current source is controlled directly, avoiding the imperfections introduced by the emitter current to collector current conversion in the differential pair. Furthermore, the switching of the differential pair is improved by introducing emitter switching instead of base switching and tying the bases of the differential pair transistors together and capacitively bypassing them to ground. This configuration eliminates transients caused during the switching process and controls base on voltages of the differential pair to avoid overdrive during switching. Additional resistors are also added to the emitters of differential pair to damp remaining transients caused during the switching process.

BRIEF DESCRIPTION OF THE DRAWINGS

The foregoing and other objects of this invention, the various features thereof, as well as the invention itself, may be more fully understood from the following detailed description, when read together with the accompanying drawings, wherein.

For the most part, and as will be apparent when referring to the figures, when an item is used unchanged in more than one figure, it is identified by the same alphanumeric reference indicator in all figures.

DETAILED DESCRIPTION OF THE PREFERRED EMBODIMENTS

Figure 2:
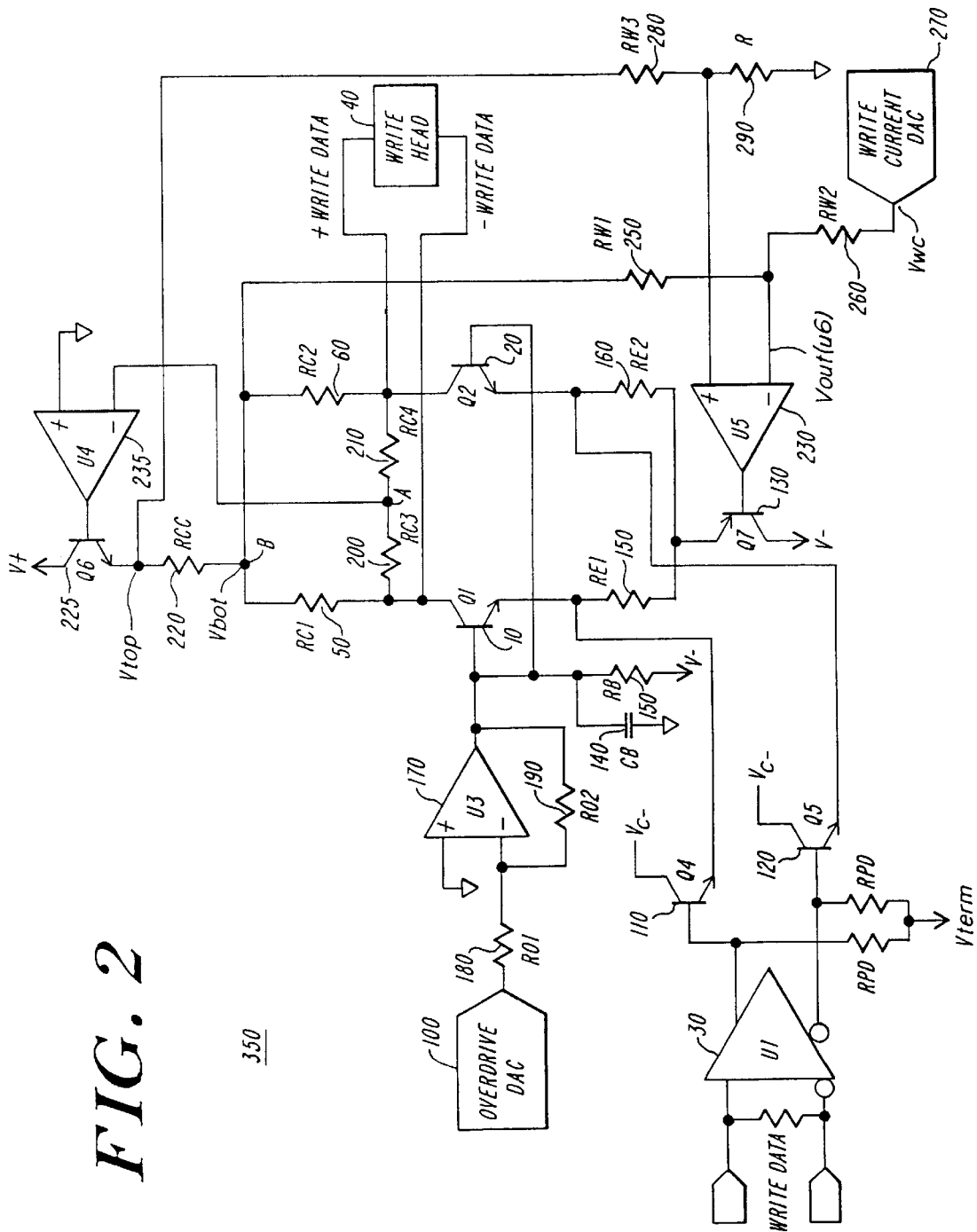
FIG. 2 is a schematic diagram of an improved write amplifier and magnetic head, in accordance with the present invention.

The present invention is an improved amplifier used in conjunction with a data writing device. In the preferred embodiment, the amplifier is a write amplifier and the data writing device is a magnetic head used for writing data onto magnetic media, such as a hard drive. The invention provides consistently low DC common-mode voltage delivered to the magnetic head, precise control of the current delivered to the magnetic head, and better switching performance within the amplifier for delivering current to the magnetic head. While the preferred embodiment addresses the application of the improved amplifier in conjunction with a magnetic head for writing data to magnetic media, those skilled in the art will appreciate that the improved amplifier could be adapted for use in other applications, where it is also desirable to have an amplifier with low output DC common-mode voltage, precise control of the output current, or improved switching substantially free of corruption of the switching waveform by transient voltages and currents within the switching mechanism. FIG. 2 is a schematic diagram illustrating the preferred embodiment of a write amplifier 350 and a magnetic write head 40, in accordance with the present invention.

The output common-mode DC voltage delivered from the amplifier to the magnetic head is kept substantially at an average of zero volts using a combination of several components, as is shown in FIG. 2. For the most part the improved amplifier changes DC voltage $V_{bot}$ in such a way that the voltage drop across resistors RC1 50 and RC2 60 for a chosen value of write current, provides a DC voltage on the collectors of transistors Q1 and Q2 close to zero volts and eliminates fluctuations in the output common-mode voltage experienced at the write head 40. As in the prior art, resistors RC1 50 and RC1 60 are each used to bias a corresponding transistor, that is Q1 10 and Q2 20, which are NPN type bipolar transistors in the preferred embodiment. Also, the resistance values of RC1 and RC2 are chosen to be much larger than the resistance value of the magnetic head 40 to prevent any significant diversion of current from the write head 40 to the resistors RC1 50 and RC2 60. In contrast to the prior art write amplifier of FIG. 1, the improved amplifier 350 of FIG. 2 includes components to provide proper voltage drop across RC1 and RC2, including two additional resistors, RC3 200 and RC4 210, connected to the collectors of transistors Q1 10 and Q2 20, wherein the resistors RC3 and RC4 also connect to each other at a common point A. Preferably, the resistance values of RC3 and RC4 are equal to each other and are much larger than the resistance values of RC1 50 and RC2 60, thereby preventing a significant diversion of current from RC1 50 and RC2 60 to RC3 and RC4. The "tops" of resistors RC1 50 and RC2 60 are coupled together, and by way of resistor RCC and adjustable voltage source power transistor Q6 to positive supply V+. The base of Q6 is driven by an OP AMP U4 235, having its non-inverting input at ground potential. The common point A of RC3 200 and RC4 210 is connected to the inverting input of OP AMP U4 235.

In this configuration, since the non-inverting input of OP AMP U4 235 is connected to ground, the OP AMP U4 maintains a potential of close to zero volts at common point A. The voltage at common point A is maintained by supplying enough current via the power transistor Q6 225 and resistor RCC 220 into RC1 50 and RC2 60 such that any voltage difference between common point A (i.e., the inverting input of U4) and the non-inverting input of U4 is dissipated across resistors RC1 50 and RC2 60. Consequently, the voltage across RC1 50 and RC2 60 does vary as a function of the current from DAC 270, but in such a way that the common mode voltage on a write head 40 remains close to zero volts. Additionally, since the input impedance of the OP AMP U4 235 is very high, no appreciable current is drawn through RC3 200 and RC4 210, which would otherwise tend to increase the problem of high common-mode voltage at the write head 40. Thus, the average DC voltage at the inputs of the write head 40 is maintained close to zero volts according to one aspect of the invention. As a result, the write amplifier 350 of FIG. 2 provides a significant improvement over the prior art write amplifier 300 of FIG. 1, which had variable and sometimes excessive common mode voltage at the inputs of the write head 40.

In another embodiment, the same effect can be achieved if the inverting input of OP AMP U4 235 is connected to the output of an additional DAC (not shown in FIG. 2), with the DAC being programmed in such a way that the DAC is reprogrammed every time the value of write current is changed and can be easily calculated based upon known value of the write current and the values of resistors RC1 50 and RC2 60 to keep the DC common mode voltage at write head 40 close to zero volts.

Referring once again to FIG. 2, the write amplifier 350 includes a voltage source adapted to control the output current delivered to write head 40, and substantially eliminate inaccuracies caused by the switching transistors Q1 and Q2. That voltage source includes a pair of resistors RE1 150 and RE2 160 coupled to the respective emitters of transistors Q1 50 and Q2 60 and then by way of the emitter of a PNP type bipolar transistor Q7 130 to a power supply V−. The base of transistor Q7 130 is driven by the output of an OP AMP U5 230 having its inverting input connected to the junction between resistor RW1 250 and resistors RW1 260, and having its non-inverting input connected to the junction between RW3 280 and RW4 290. The other side of resistor RW3 280 is connected to the emitter of Q6 and other side of resistor RW4 290 is connected to ground potential.

The write current through write head 40 is provided by switching of transistors Q1 and Q2. If transistor Q1 is ON and transistor Q2 is off, the current from emitter of Q6 through resistor RCC 220, resistor RC2 60 and write head 40 passes to collector of Q1. At the same time, the current from emitter Q6 through resistor RCC 220 and resistor RC1 50 passes to the same collector of Q1. Thus, the current through transistor Q1 is approximately twice the amplitude of the zero-to-peak current through write head 40. If transistor Q2 is ON and Q1 is OFF, the current through write head 40 changes polarity and passes from emitter Q6 through resistor RCC 220, resistor RC1 50, write head 40 to the collector of Q2. As a before, extra current from emitter Q6 passes through RCC 220 and RC2 60 to collector Q2.

With this configuration, the current through resistor RCC 220 is approximately equal to the peak-to-peak current through write head 40 (if RC2 and RC1 are substantially bigger than the impedance of write head 40). Therefore, the write current is controlled by measurement and adjustment of the voltage across of resistor RCC 220.

The following equation define the relation between the output voltage $V_{WC}$ of write current DAC 270 and the value of the write current $I_W$.

$$I_w = \frac{V_{top} - V_{bot}}{RCC} = \frac{V_{RCC}}{RCC} \quad (01)$$

Equalizing the voltages at the inputs of OP AMP U5 230, $$\frac{V_{top} - V_{RCC} - kV_{top}}{RW1} = \frac{V_{top} - V_{WC}}{RW2} \quad \text{or}$$

$$\frac{V_{top}(1-k)}{RW1} - \frac{V_{top}}{RW2} = \frac{V_{RCC}}{RW1} - \frac{V_{WC}}{RW2}, \text{ where}$$

$$k = \frac{RW4}{RW3 + RW4}$$

to make value of write current proportioned to $V_{WC}$:

$$\frac{V_{RCC}}{RW1} - \frac{V_{WC}}{RW2} = 0 \text{ and}$$

$$V_{RCC} = V_{WC} \frac{RW1}{RW2} \text{ and from (01)}$$

$$I_W = V_{WC} \frac{RW1}{RCC \cdot RW2}$$

As it can be seen from equation (2), the value of the write current $I_W$ can be adjusted by write current DAC 270 setting without any losses due to the imperfections of the bipolar transistors Q1, Q2 and Q7.

The relative value of RCC 220 compared RC1 50 and RC2 60 is small so as not to increase the overall power dissipation of the circuit significantly. However, resistance of RCC 220 is large enough so that the minimum voltage drop across it is large compared to the typically small offset voltages of OP AMP U5 230. As a result, the write amplifier 350 of the preferred embodiment provides a significant improvement over the prior art write amplifier 300 of FIG. 1, in that the current delivered to the write head 40 can be set with a great deal of precision, such precision not being available in the prior art amplifier.

The present invention also provides for improved switching, or steering, of the write current within the amplifier. In the preferred embodiment, the turning on and off of transistors Q1 10 and Q2 20 is accomplished using emitter switching, rather than base switching. This implementation reduces the resonance effect at the emitters by reducing the resistance seen by them as well as reducing Miller's effect from base-collector capacitance of Q1 and Q2.

Figure 1:
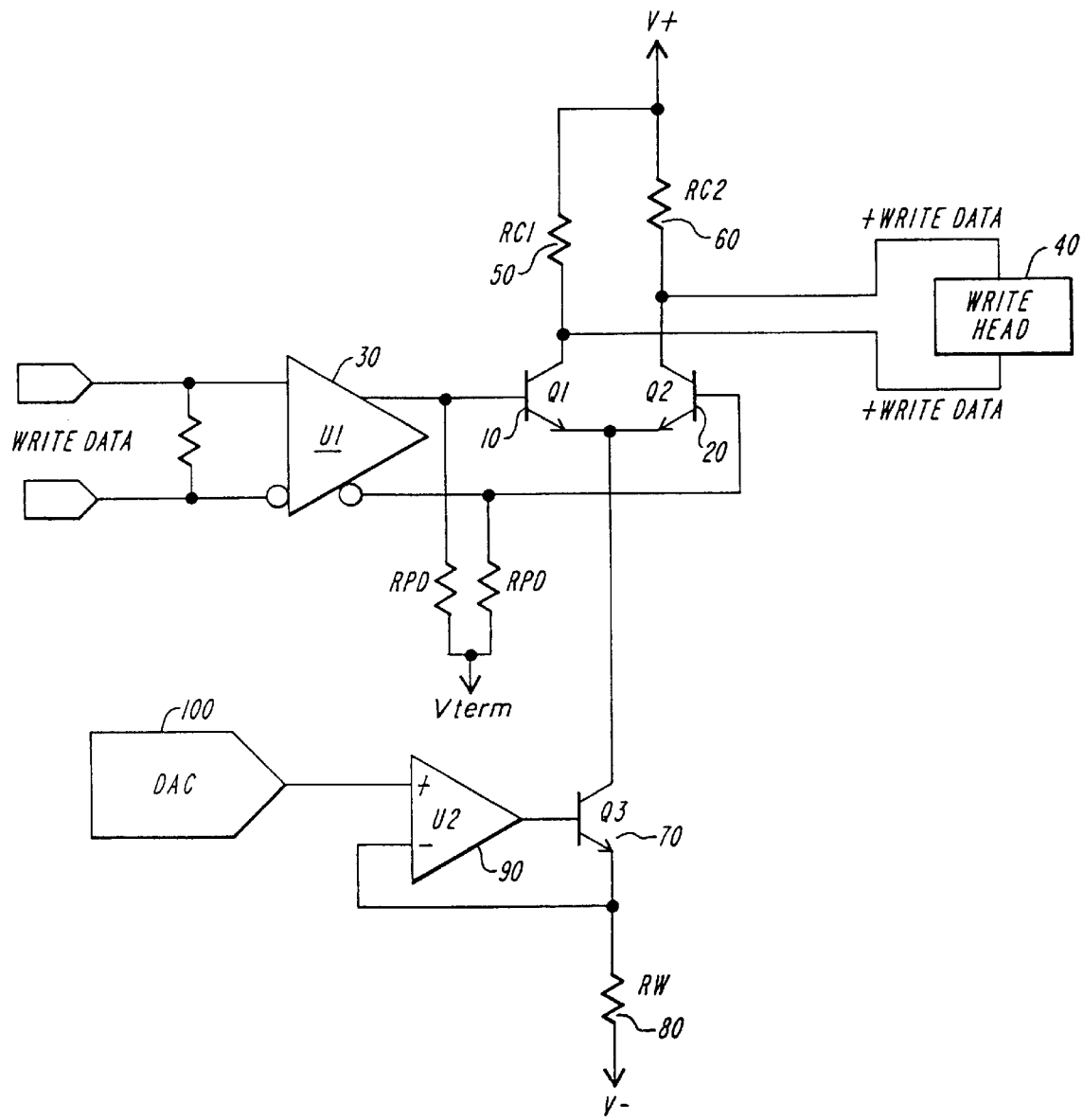
FIG. 1 is a schematic diagram of a prior art write amplifier and magnetic head.

The current switching configuration includes an input write data driver U1 30 which is similar to that in the amplifier 30 of FIG. 1, augmented by an additional NPN type bipolar emitter follower transistor connected to each output of differential write data receiver U1 30, that is, Q4 110 and Q5 120. Transistors Q4 and Q5 are biased by resistors RPD coupled to a negative voltage $V_{term}$ which can be, for example, V−. The emitter of transistor Q4 is coupled to the junction between the emitter of Q1 and resister RE1 150, and the emitter of transistor Q5 is coupled to the junction between the emitter of Q2 and resister RE2 160. Further, the bases of Q1 10 and Q2 20 are tied together and capacitively bypassed to ground through capacitor CB 140.

With this configuration, the voltage at the bases of Q1 10 and Q2 20 does not change during the switching process. Further, the base voltages of Q1 and Q2 are set statically by the combination of an overdrive DAC 100 and OP AMP U3 170 and associated resistors RO1 180 and RO2 190 unlike the prior art circuit of FIG. 1, where the transistors Q1 10 and Q2 20 were turned on and off as a differential pair by changing the relative voltage on their bases. As an improvement, in the present invention, Q1 10 and Q2 20 are turned on and off at their emitters by current from the emitters of Q4 110 and Q5 120. Collectors of Q4 and Q5 are connected to some negative voltage $V_{C-}$. The voltages on the bases of Q4 110 and Q5 120 are alternately raised and lowered by the differential receiver U1 30, similar to the treatment of Q1 10 and Q2 20 in the prior art case. However, due to the current steering by emitters of Q1 10 and Q2 20 in the present invention, there is no Miller Effect realized in the switching of Q1 10 and Q2 20, because the transients caused by the base switching of Q1 and Q2 in the prior art case are not present in the preferred embodiment of the present invention. Consequently, a large source of potential undershoot and overshoot is substantially eliminated.

Additionally, the values of the emitter resistors RE1 150 and RE2 160 are preferably made small because the write head current is supplied by the feedback of the circuit (i.e., Q1 and Q2 collector feedback through U5), as described previously. Therefore, the resistors RE1 150 and RE2 160 provide a damping effect on any remaining transients occurring during the switching process and thereby further preserves the current switching waveform (i.e., write data current). As in the prior art, the switching waveform is a square wave in the preferred embodiment. Furthermore, since the base voltages of Q1 10 and Q2 20 are programmable through DAC 100, as described above, DAC 100 can be programmed to be such that the reverse-bias on the emitter-base junction of the transistors Q1 10 and Q2 20 is significantly smaller when they are turned off, as compared to the prior art amplifier 300, thereby reducing another source of overshoot and undershoot.

Typically, and in the preferred embodiment, U1 30 is an emitter coupled logic (ECL) receiver with a preset output voltage swing of approximately 0.8 volts. It is relatively difficult to control the amplitude of this swing as seen by the bases of the differential pair Q1 10 and Q2 20, because it is not easy to control the amplitude of a high frequency signal with great precision, generally. Therefore, according to the present invention, the base voltages of the current switching transistors Q1 10 and Q2 20, which are provided by DAC 100 and U3 170 and not by U1 30, are significantly more precise than in the prior art and, consequently, there is substantially no loss of the frequency content of the switching signal provided by U1 30.

The present invention, which is embodied in a novel circuit configuration, achieves an improved amplifier and write head with superior control of the output common-mode voltage at the write head, write current control, and current switching. As will be appreciated by those skilled in the art, the invention may be embodied in other specific forms without departing from the spirit or central characteristics thereof. And, the improvements described herein with respect to a magnetic write head and amplifier may also prove beneficial in other amplifier circuits. The present embodiments are, therefore, to be considered in all respects as illustrative and not restrictive, the scope of the invention being indicated by appending claims rather than by the foregoing description, and all changes that come within the meaning and range of equivalency of the claims are therefore intended to be embraced therein.

What is claimed is:

1. A write amplifier comprising:
   A. an emitter coupled pair of transistors, including a first transistor and a second transistor, each of said first and second transistors having an emitter, a base, and a collector, wherein:
      i. said collectors are each coupled by way of an associated collector resistor to a first reference potential, and are adapted to permit coupling of a magnetic write head therebetween,
      ii. said emitters are each coupled to a common node, said common node being coupled to a voltage source, and
      iii. said bases of said first and second transistors are coupled together and are AC coupled to a second reference potential, and
      wherein further, an emitter resistor is coupled between said common node and the respective emitters of said first and second transistors, and
   B. a write data current steering network responsive to an applied binary write data signal to generate first and second write drive signals, said first and second write drive signals being complimentary, wherein said write data current steering network includes means for coupling said first and second write drive signals to a respective one of said emitters of said first and second transistors, whereby current from said voltage source is switched between said first and second transistors as a function of the binary value of said applied binary write data signal.

2. A write amplifier according to claim 1, further comprising:
   a common mode voltage controller including:
      i. an adjustable voltage source coupled between said first reference potential and said collector resistors, said voltage source being responsive to an applied average signal to control current applied to said collector resistors to be substantially proportional thereto, and
      ii. an averaging network coupled between said collectors of said first and second transistors, and adapted to generate said average signal representative of the average of the voltages at said collectors, and to apply said average signal to said adjustable current limiter.

3. A write amplifier according to claim 2, wherein
   A. said voltage source includes a transistor having an emitter, a base, and a collector, said emitter being resistively coupled to said collector resistors, said collector being coupled to said first reference potential, and said base having coupled to said average signal, and
   B. said averaging network includes a pair of series coupled resistors coupled between said collectors of said transistors and having an intermediate junction therebetween, and a differential amplifier having an output providing said average signal, said differential amplifier further having a non-inventing input coupled to a fourth reference potential, and an inverting input coupled to the said junction of said series coupled resistors.

4. A write amplifier according to claim 3, wherein said voltage source includes a voltage source transistor having an emitter, a base and a collector, and establishing a first current path through said emitter and collector between said second reference potential and said emitter of said first transistor, and establishing a second current path through said emitter and collector between said second reference potential and said emitter of said second transistor, wherein said current source transistor is responsive to said applied write current signal to drive a current proportional thereto along one of said first and second current paths.

5. A write amplifier according to claim 4, further including a current network for generating said current signal, said current network including a differential amplifier having
   i. an output coupled to said base of said voltage source transistor,
   ii. a non-inverting input coupled by a voltage divider to a potential between a fifth reference potential and the emitter of said limiter transistor, and
   iii. an inverting input resistively coupled to an applied input write current signal and resistively coupled to said collector resistors.

6. A write amplifier comprising:
   A. an emitter coupled pair of transistors, including a first transistor and a second transistor, each of said first and second transistors having an emitter, a base, and a collector, wherein:
      i. said collectors are each coupled by way of an associated collector resistor to a first reference potential, and are adapted to permit coupling of a magnetic write head therebetween,
      ii. said emitters are each coupled to a common node, said common node being coupled to a voltage source, and
      iii. said bases of said first and second transistors are coupled together and are AC coupled to a second reference potential, and
   B. a write data current steering network responsive to an applied binary write data signal to generate first and second write drive signals, said first and second write drive signals being complimentary, wherein said write data current steering network includes means for coupling said first and second write drive signals to a respective one of said first and second transistors, whereby current from said voltage source is switched between said first and second transistors as a function of the binary value of said applied binary write data signal, and C. a common mode voltage controller including:
   i. an adjustable voltage source coupled between said first reference potential and said collector resistors, said voltage source being responsive to an applied average signal to control current applied to said collector resistors to be substantially proportional thereto, and
   ii. an averaging network coupled between said collectors of said first and second transistors, and adapted to generate said average signal representative of the average of the voltages at said collectors, and to apply said average signal to said adjustable voltage source.

7. A write amplifier according to claim 6, wherein
   A. said adjustable voltage source includes a transistor having an emitter, a base, and a collector, said emitter being resistively coupled to said collector resistors, said collector being coupled to said first reference potential, and said base having coupled to said average signal, and
   B. said averaging network includes a pair of series coupled resistors coupled between said collectors of said transistors and having an intermediate junction therebetween, and a differential amplifier having an output providing said average signal, said differential amplifier further having a non-inventing input coupled to a fourth reference potential, and an inverting input coupled to the said junction of said series coupled resistors.

8. A write amplifier according to claim 7, wherein said voltage source includes a voltage source transistor having an emitter, a base and a collector, and establishing a first current path through said emitter and collector between said second reference potential and said emitter of said first transistor, and establishing a second current path through said emitter and collector between said second reference potential and said emitter of said second transistor, wherein said current source transistor is responsive to said applied write current signal to drive a current proportional thereto along one of said first and second current paths.

9. A write amplifier according to claim 8, further including a current network for generating said current signal, said current network including a differential amplifier having
   i. an output coupled to said base of said voltage source transistor,
   ii. a non-inverting input coupled by a voltage divider to a potential between a fifth reference potential and the emitter of said adjustable voltage source transistor, and
   iii. an inverting input resistively coupled to an applied input write current signal and resistively coupled to said collector resistors.

10. A write amplifier, for operative communication with a magnetic write head for writing data onto a media, the write amplifier comprising:
    a data receiver which receives data to be written by the magnetic write head and generates therefrom a corresponding first data waveform and a corresponding second data waveform, wherein the second data waveform is substantially an inverted form of the first data waveform;
    a write current generator for generating a write current;
    a steering circuit defining a first and a second electrical path and which is responsive to the first and second data waveforms to selectively steer the write current to the magnetic write head via the first path or second path as a function of the first and second data waveforms; and
    a voltage supply circuit in operative communication with said steering circuit, wherein said voltage supply substantially maintains the average DC voltage applied to the magnetic write head at zero volts.

11. The write amplifier of claim 10, wherein the first path includes a first switch through which current flows as a function of said first data waveform and wherein said second path includes a second switch through which current flows as a function of said second data waveform, and wherein said voltage supply includes:
    a first and a second impedance device connected in series, at a common point, and coupling a collector of said first switch to a collector of said second switch;
    an operational amplifier having an output, a non-inverting input and an inverting input, wherein the non-inverting input is coupled to ground potential, the inverting input is connected to said common point, and the output is coupled to the base of a voltage supply transistor; and
    a first biasing resistor coupling a collector of said first switch to said emitter of said voltage supply transistor and a second biasing resistor coupling a collector of said second switch to said emitter of said voltage supply transistor, wherein the collector of said voltage supply transistor is coupled to a voltage source.

12. A write amplifier according to claim 1 further comprising
    means for adjustably controlling the DC voltage at the bases of said first and second transistors whereby overdrive of said first and second transistors is relatively small.

* * * * *